(12) United States Patent
Ye

(10) Patent No.: US 10,083,895 B2
(45) Date of Patent: Sep. 25, 2018

(54) PACKAGE STRUCTURE FOR POWER CONVERTER AND MANUFACTURE METHOD THEREOF

(71) Applicant: Silergy Semiconductor Technology (Hangzhou) LTD, Hangzhou, ZheJiang Province (CN)

(72) Inventor: Jiaming Ye, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 65 days.

(21) Appl. No.: 15/001,397

(22) Filed: Jan. 20, 2016

(65) Prior Publication Data
US 2016/0218087 A1 Jul. 28, 2016

(30) Foreign Application Priority Data
Jan. 23, 2015 (CN) .......................... 2015 1 0035298

(51) Int. Cl.
*H01L 23/495* (2006.01)
*H01L 25/16* (2006.01)

(52) U.S. Cl.
CPC .. *H01L 23/49503* (2013.01); *H01L 23/49513* (2013.01); *H01L 23/49562* (2013.01); *H01L 23/49575* (2013.01); *H01L 25/16* (2013.01); *H01L 2224/05553* (2013.01); *H01L 2224/27013* (2013.01); *H01L 2224/32245* (2013.01); *H01L 2224/48091* (2013.01); *H01L 2224/48137* (2013.01); *H01L 2224/48247* (2013.01); *H01L 2224/73265* (2013.01); *H01L 2924/181* (2013.01)

(58) Field of Classification Search
CPC .... B64B 1/62; B64B 1/40; B64B 1/58; B64C 2201/022; B64C 2201/122; B64C 257/321; H01L 27/11543; H01L 29/7883; H01L 27/11517; H01L 27/11519; H01L 27/11521; H01L 27/11524; H01L 27/11526; H01L 27/11529; H01L 27/11
See application file for complete search history.

(56) References Cited

U.S. PATENT DOCUMENTS 5,965,947 A * 10/1999 Nam ....................... H01L 24/06
257/701
2003/0102489 A1 6/2003 Nam
(Continued)

FOREIGN PATENT DOCUMENTS

CN 101241904 A 8/2008
CN 101615609 A 12/2009

*Primary Examiner* — Julio J Maldonado
*Assistant Examiner* — Stanetta Isaac
(74) *Attorney, Agent, or Firm* — Michael C. Stephens, Jr.

(57) ABSTRACT

A package structure of a power converter, can include: a die pad; an insulation adhesive layer and a conductive adhesive layer on the die pad; a control circuit die on the insulation adhesive layer, where the insulation adhesive layer comprises a first insulation adhesive layer on a back surface of the control circuit die, and a second insulation adhesive on a surface of the die pad, where the first insulation adhesive layer is connected to the second insulation adhesive layer; and a power device die on the conductive adhesive layer, where the insulation adhesive layer is separated from the conductive adhesive layer.

16 Claims, 16 Drawing Sheets

(56) References Cited

U.S. PATENT DOCUMENTS

| | | | |
|---|---|---|---|
| 2003/0137040 A1* | 7/2003 | Standing | H01L 23/047 257/685 |
| 2004/0262774 A1 | 12/2004 | Kang et al. | |
| 2005/0275061 A1 | 12/2005 | Ohguro | |
| 2009/0039869 A1 | 2/2009 | Williams | |
| 2010/0032816 A1* | 2/2010 | Mahler | B81C 1/00253 257/666 |
| 2010/0090331 A1* | 4/2010 | Joshi | H01L 23/492 257/692 |
| 2011/0134613 A1 | 6/2011 | Moussaoui | |
| 2011/0163434 A1* | 7/2011 | Bell | H01L 21/823487 257/676 |
| 2011/0298528 A1 | 12/2011 | Endo | |
| 2012/0322202 A1 | 12/2012 | Nishimura | |
| 2013/0299957 A1 | 11/2013 | Kobayashi et al. | |

\* cited by examiner ature. On the contrary,
PACKAGE STRUCTURE FOR POWER CONVERTER AND MANUFACTURE METHOD THEREOF

RELATED APPLICATIONS

This application claims the benefit of Chinese Patent Application No. 201510035298.4, filed on Jan. 23, 2015, which is incorporated herein by reference in its entirety.

FIELD OF THE INVENTION

The present disclosure generally relates to the field of chip package, and more particularly, to package structure for power converter and manufacture method thereof.

BACKGROUND

Power devices form the foundation of power electronic technology. In many application (e.g., power converters, LED drivers, etc.) power devices are controlled to periodically turn on/off under by a control circuit. When power devices and the control circuit are encapsulated in a single package structure, the volume of the power supply can be decreased, and the use of periphery electronic components can be reduced, in order to facilitate miniaturization, and to lower power supply costs.

SUMMARY

In one embodiment, a package structure of a power converter, can include: (i) a die pad; (ii) an insulation adhesive layer and a conductive adhesive layer on the die pad; (iii) a control circuit die on the insulation adhesive layer, where the insulation adhesive layer comprises a first insulation adhesive layer on a back surface of the control circuit die, and a second insulation adhesive on a surface of the die pad, where the first insulation adhesive layer is connected to the second insulation adhesive layer; and (iv) a power device die on the conductive adhesive layer, where the insulation adhesive layer is separated from the conductive adhesive layer.

In one embodiment, a method of making a package structure for a power converter, can include: (i) a forming a conductive adhesive layer on a first region of a die pad; (ii) arranging a power device die on the conductive adhesive layer; (iii) forming a first insulation adhesive layer on a back surface of the control circuit die by a wafer backside coating (WBC) process; (iv) forming a second insulation adhesive layer on a second region of the die pad by a dispensing process; and (v) arranging the control circuit die on the second insulation adhesive layer to connect the first insulation adhesive layer to the second insulation adhesive layer, where the insulation adhesive layer is separated from the conductive adhesive layer.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

For a package structure of a power converter, because a high voltage surge of the power devices may cause incorrect operation and/or leakage current to the control circuit, power devices should be isolated from the control circuit.

Figure 1:
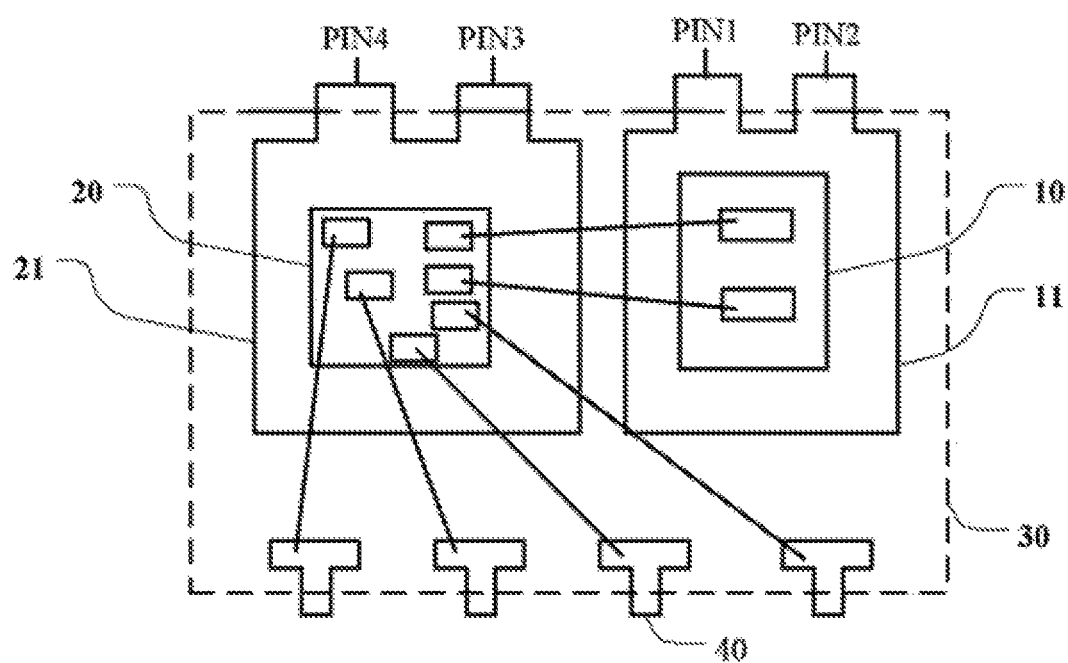
FIG. 1 is a top view of a first example package structure of a power converter.

Referring now to FIG. 1, shown is a top view of a first example package structure of a power converter. In this diagram, the boundary of encapsulation compound 30 overlapping power dies and control circuit is indicated by dotted lines. In this particular example, power device die 10 and control circuit die 20 may be arranged on isolated die pads 11 and 21, respectively. Power device die 10 can connect to control circuit die 20 by bonding wires, and control circuit die 20 can connect to pin 40 by bonding wires. Power device die 10 and control circuit die 20 connected by bonding wires may be isolated from each other, in order to achieve good high voltage isolation. However, because die pad 11 for power device die 10, and die pad 21 for control circuit die 20 are arranged in parallel, the area of die pad 11 may be limited. Further, the heat of die pad 11 may only be dissipated through two pins (e.g., PIN1 and PIN2) to the external environment, which may decrease the heat dissipation performance.

Figure 2:
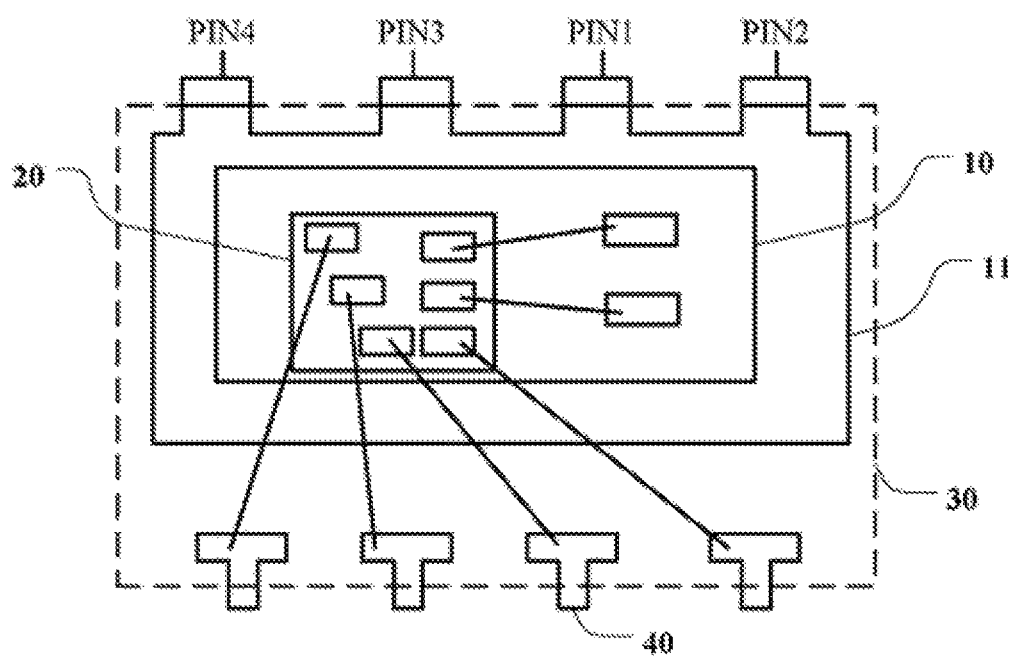
FIG. 2 is a top view of a second example package structure of a power converter.

Referring now to FIG. 2, shown is a top view of a second example package structure of a power converter. In this example, power device die 10 is arranged on die pad 11 of a larger area than the previous example, and control circuit die 20 is stacked on power device die 10 through an insulation adhesive. Further, the heat of die pad 11 can be dissipated through four pins (e.g., PIN1 to PIN4) to the external environment, which can improve the heat dissipation performance. However, the thickness of the package structure, as well as the length of bonding wires may be increased, which can correspondingly increase manufacturing costs, and decrease circuit performance.

In one embodiment, a package structure of a power converter, can include: (i) a die pad; (ii) an insulation adhesive layer and a conductive adhesive layer on the die pad; (iii) a control circuit die on the insulation adhesive layer, where the insulation adhesive layer comprises a first insulation adhesive layer on a back surface of the control circuit die, and a second insulation adhesive on a surface of the die pad, where the first insulation adhesive layer is connected to the second insulation adhesive layer; and (iv) a power device die on the conductive adhesive layer, where the insulation adhesive layer is separated from the conductive adhesive layer.

In one embodiment, a method of making a package structure for a power converter, can include: (i) a forming a conductive adhesive layer on a first region of a die pad; (ii) arranging a power device die on the conductive adhesive layer; (iii) forming a first insulation adhesive layer on a back surface of the control circuit die by a wafer backside coating (WBC) process; (iv) forming a second insulation adhesive layer on a second region of the die pad by a dispensing process; and (v) arranging the control circuit die on the second insulation adhesive layer to connect the first insulation adhesive layer to the second insulation adhesive layer, where the insulation adhesive layer is separated from the conductive adhesive layer.

Figure 3A:
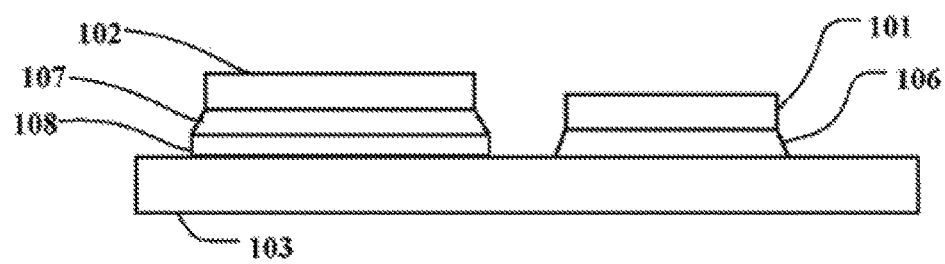
FIGS. 3A-3C are cross-section, top, and perspective stereograph views of a first example package structure of a power converter, in accordance with embodiments of the present invention.
Figure 3B:
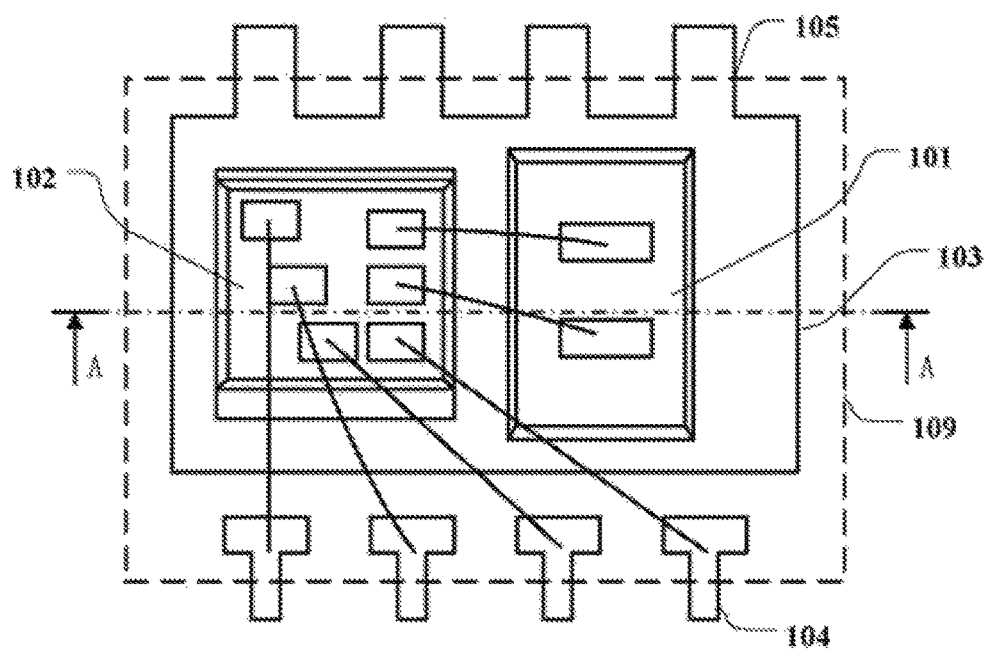
Figure 3C:
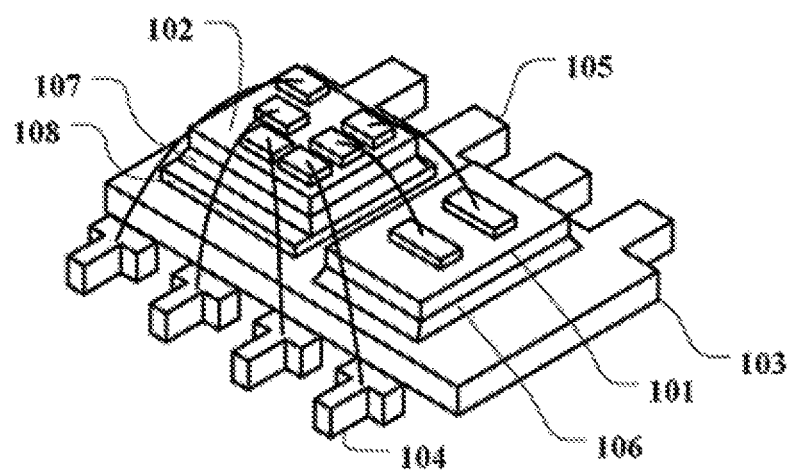

Referring now to FIGS. 3A-3C, shown are cross-section, top, and perspective stereograph views of a first example package structure of a power converter, in accordance with embodiments of the present invention. The cross-sectional view of FIG. 3A is obtained by cutting along line A-A of FIG. 3B. Also, the boundary of encapsulation compound 109 overlapping power dies and control circuit is indicated by dotted lines.

In this particular example, the package structure of a power converter can include encapsulation compound 109, die pad 103, conductive adhesive layer 106, insulation adhesive layer 107, insulation adhesive layer 108, pins 104, and pins 105. Die pad 103, pins 104, and pins 105 may be configured as different portions of a leadframe, and die pad 103 and four pins 105 can be formed integrally. For example, the leadframe can be formed by copper, and by a stamping process. Conductive adhesive layer 106 can be arranged on die pad 103, and power device die 101 may be arranged on conductive adhesive layer 106. Conductive adhesive layer 106 can be configured as a heat dissipation path, as well as an electrical connection path between die pad 103 and power device die 101. Also, the heat of power device die 101 can be well dissipated by pins 105.

Insulation adhesive layer 107 (e.g., epoxy) can be formed on the back surface of control circuit die 102 by at least one wafer backside coating (WBC) process. The thickness of epoxy layer generated by such a WBC process can be approximately 20 um. Insulation adhesive layer 108 (e.g., epoxy) can be formed on die pad 103, such as by a dispensing process. The thickness of this epoxy layer generated by the WBC process step can also be approximately 20 um. When insulation adhesive layer 108 is cured, control circuit die 102 with insulation adhesive layer 107 may be arranged on insulation adhesive layer 108. Control circuit die 102 can be fixed above die pad 103 through insulation adhesive layers 107 and 108. An insulation adhesive layer with thickness of approximately 30 um and including insulation adhesive layer 107 may be formed by a WBC process step, and insulation adhesive layer 108 formed by a dispensing process step can achieve high voltage isolation between control circuit die 102 and power device die 101.

Die pad 103 may occupy the largest area portion of the entire package structure, and can be connected to all of pins 105 on one side of the package structure, in order to provide an improved heat dissipation path for power device die 101. Because the total thickness of insulation adhesive layers 107 and 108 can be about 30 um, the space between control circuit die 102 and die pad 103 can be adequate to achieve a relatively high voltage isolation between control circuit die 102 and die pad 103.

Figure 9:
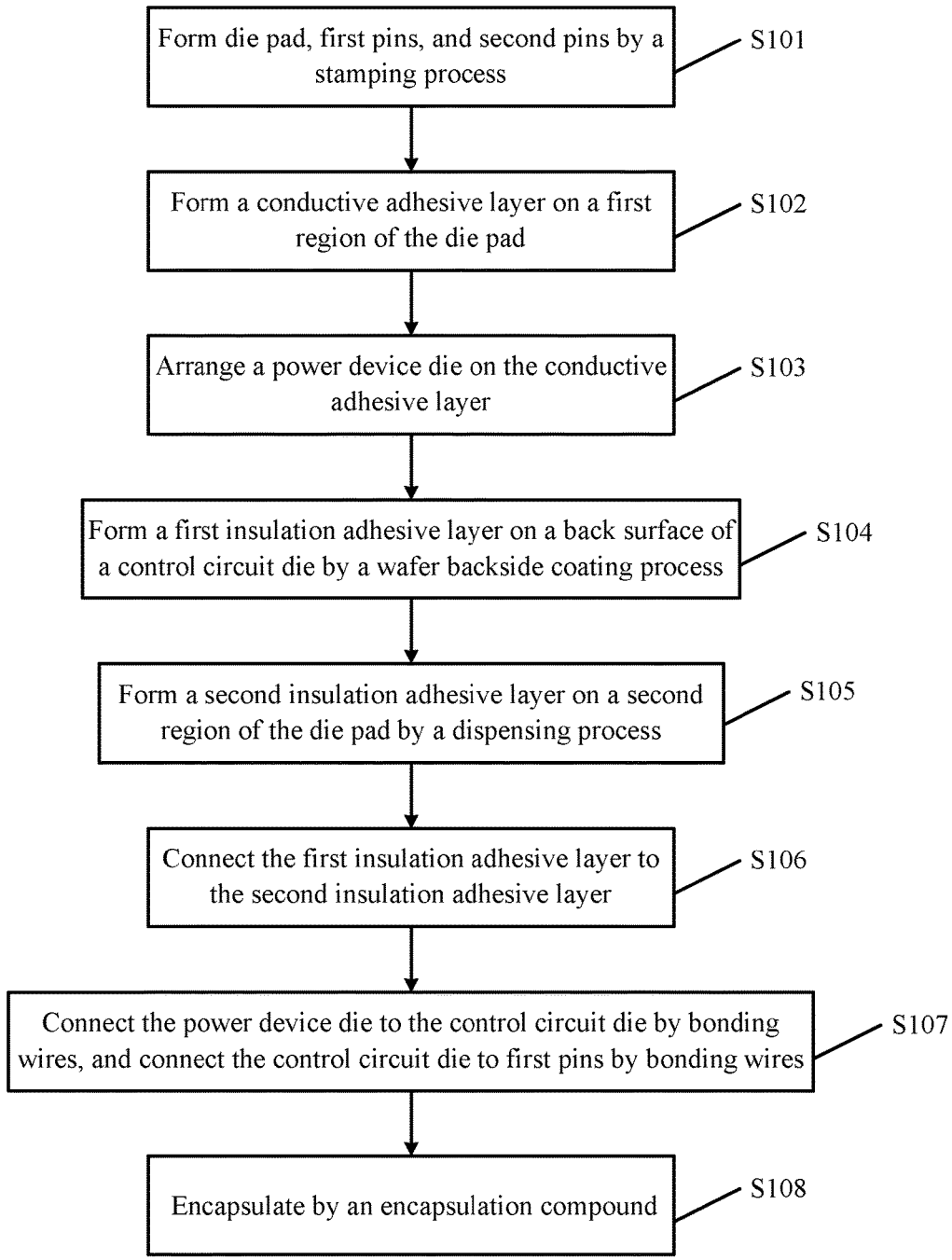
FIG. 9 is a flow diagram of a first example method of making a package structure of a power converter, in accordance with embodiments of the present invention.

Referring now to FIG. 9, shown is a flow diagram of a first example method of making a package structure of a power converter, in accordance with embodiments of the present invention. At S101, die pad 103, pins 104, and pins 105 can be formed by stamping process. At S102, conductive adhesive layer 106 can be formed on a first region of die pad 103. At S103, power device die 101 can be arranged on conductive adhesive layer 106.

At S104, insulation adhesive layer 107 can be formed on the back surface of control circuit die 102 by a WBC process. At S105, insulation adhesive layer 108 can be formed on a second region of die pad 103 by a dispensing process. At S106, insulation adhesive layer 107 can be connected to insulation adhesive layer 108. At S107, power device die 101 can be connected to control circuit die 102 by bonding wires, and control circuit die 102 can be connected to pins 104 by bonding wires. At S108, the structure can be encapsulated by an encapsulation compound.

Figure 4A:
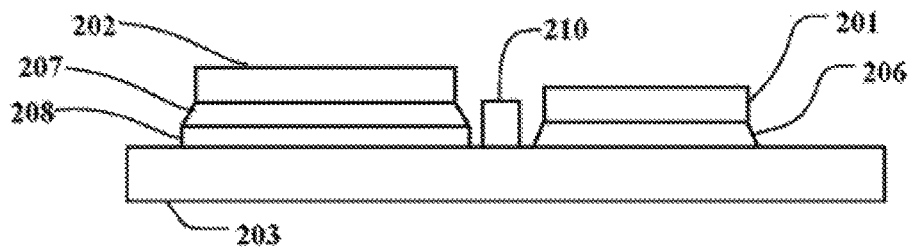
FIGS. 4A-4C are cross-section, top, and perspective stereograph views of a second example package structure of a power converter, in accordance with embodiments of the present invention.
Figure 4B:
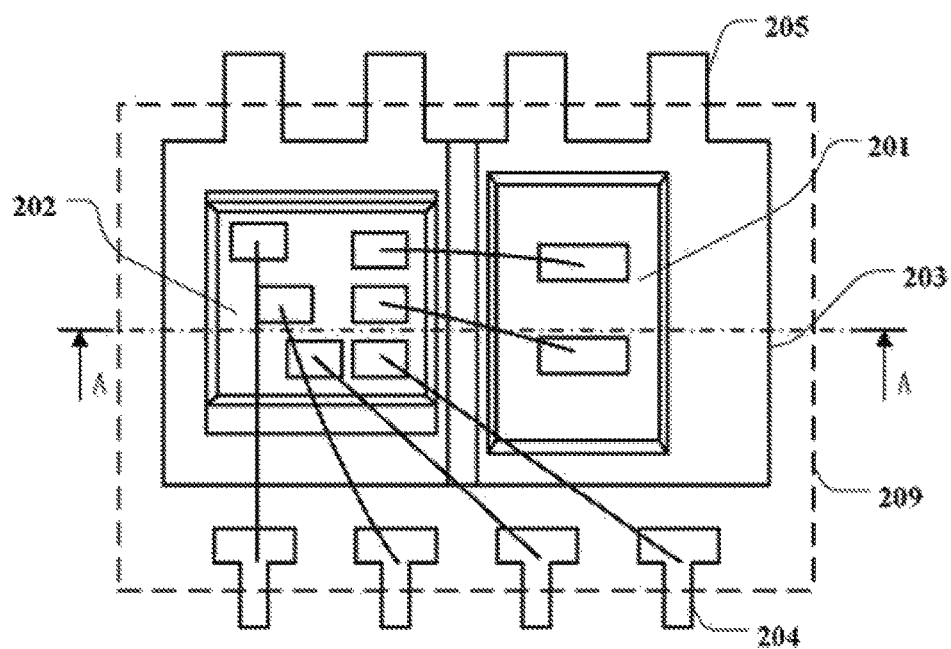
Figure 4C:
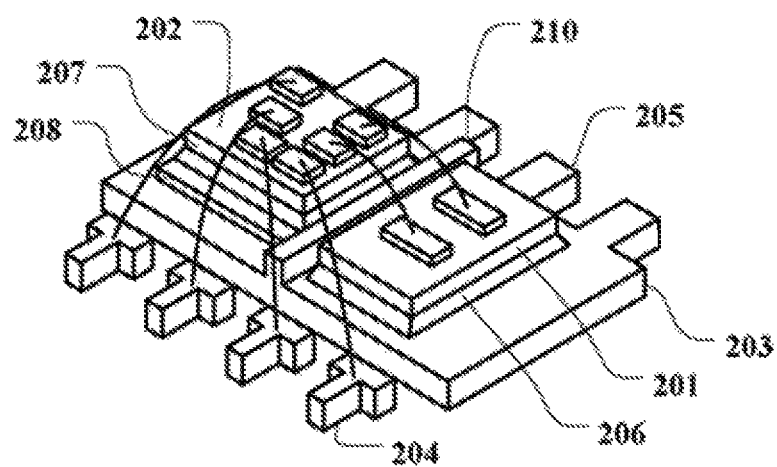

Referring now to FIGS. 4A-4C, shown are cross-section, top, and perspective stereograph views of a second example package structure of a power converter, in accordance with embodiments of the present invention. The cross-sectional view of FIG. 4A is obtained by cutting along line A-A of FIG. 4B. Also, the boundary of encapsulation compound 209 overlapping power dies and control circuit is indicated by dotted lines. The package structure of a power converter in this example can include encapsulation compound 209, die pad 203, side wall 210, conductive adhesive layer 206, insulation adhesive layer 207, insulation adhesive layer 208, pins 204, and pins 205.

Die pad 203, pins 204, and pins 205 can be configured as different portions of a leadframe, and die pad 203, and four pins 205 can be formed integrally. The leadframe can be formed by copper, and by stamping process. Conductive adhesive layer 206 can be arranged on die pad 203, and power device die 201 may be arranged on conductive adhesive layer 206. Conductive adhesive layer 206 may provide a heat dissipation path, as well as electrical connection path between die pad 203 and power device die 201. In this way, the heat of power device die 201 can be well dissipated by pins 205. Die pad 203 may occupy a largest area of the entire package structure, and can be connected to all of the pins 205 on one side of the package structure to provide improved heat dissipation path for power device die 201.

Insulation adhesive layer 207 (e.g., epoxy) can be formed on the back surface of control circuit die 202 by at least one WBC process. Insulation adhesive layer 208 can be formed on die pad 203 by a dispensing process. When insulation adhesive layer 208 is cured, control circuit die 202 with insulation adhesive layer 207 can be arranged on insulation adhesive layer 208. Control circuit die 202 may be fixed above die pad 203 through insulation adhesive layers 207 and 208. An insulation adhesive layer with a thickness of approximately 30 um including insulation adhesive layers 207 and 208 can be configured to achieve high voltage isolation between control circuit die 202 and power device die 201.

Side wall 210 formed by insulation material can be arranged on die pad 203, and between conductive adhesive layer 206 and the insulation adhesive layer including insulation adhesive layers 207 and 208. Side wall 210 can be formed integrally with die pad 203 as portions of the leadframe. For example, side wall 210 can surround at least one of power device die 201 and control circuit die 202. Prior to curing, conductive adhesive layer 206 may flow to the region beneath control circuit die 202, and conductive adhesive layer 206 may be connected to insulation adhesive layers 207 and 208. However, side wall 210 can block the flow of conductive adhesive layer 206, in order to separate conductive adhesive layer 206 and the insulation adhesive layer. The space between conductive adhesive layer 206 and the insulation adhesive layer (e.g., including insulation adhesive layers 207 and 208) can be reduced to decrease the length of bonding wires, which may improve electrical performance, and decrease the volume of the package structure.

Figure 10:
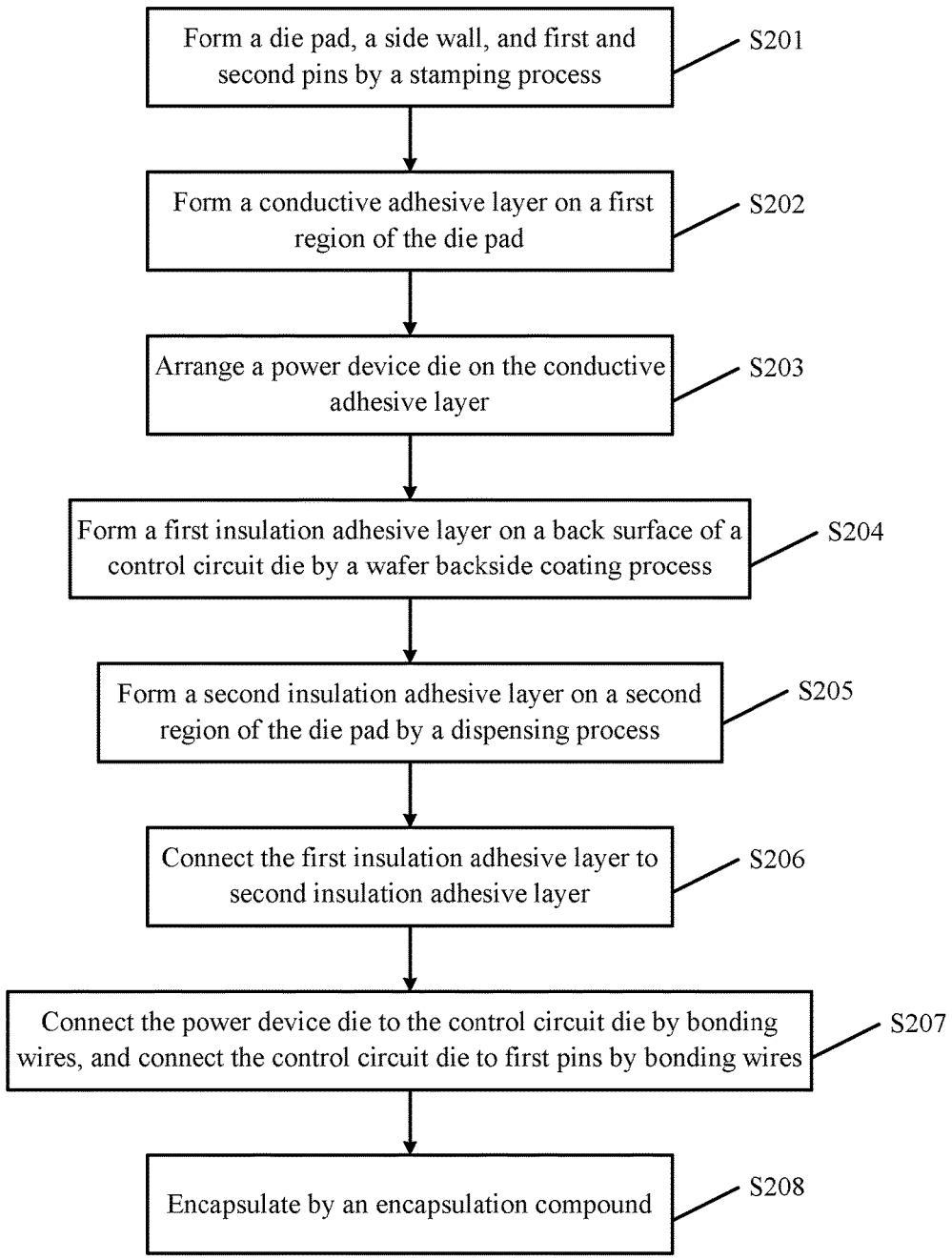
FIG. 10 is a flow diagram of a second example method of making a package structure of a power converter, in accordance with embodiments of the present invention.

Referring now to FIG. 10, shown is a flow diagram of a second example method of making a package structure of a power converter, in accordance with embodiments of the present invention. At S201, die pad 203, side wall 210, pins 204, and pins 205 can be formed, such as by a stamping process. At S202, conductive adhesive layer 206 can be formed on a first region of die pad 203. At S203, power device die 201 can be arranged on conductive adhesive layer 206. At S204, insulation adhesive layer 207 can be formed on the back surface of control circuit die 202, such as by a WBC process. At S205, insulation adhesive layer 208 can be formed on a second region of die pad 203, such as by a dispensing process. At S206, insulation adhesive layer 207 can be connected to insulation adhesive layer 208. At S207, power device die 201 can be connected to control circuit die 202 by bonding wires, and connecting control circuit die 202 can be connected to pins 204 by bonding wires. At S208, the structure can be encapsulated by an encapsulation compound.

Figure 5A:
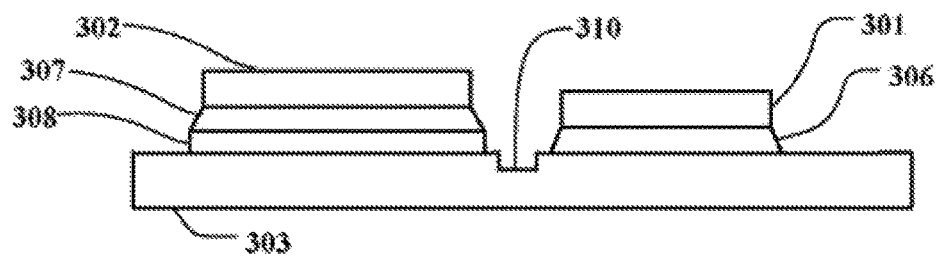
FIGS. 5A-5C are cross-section, top, and perspective stereograph views of a third example package structure of a power converter, in accordance with embodiments of the present invention.
Figure 5B:
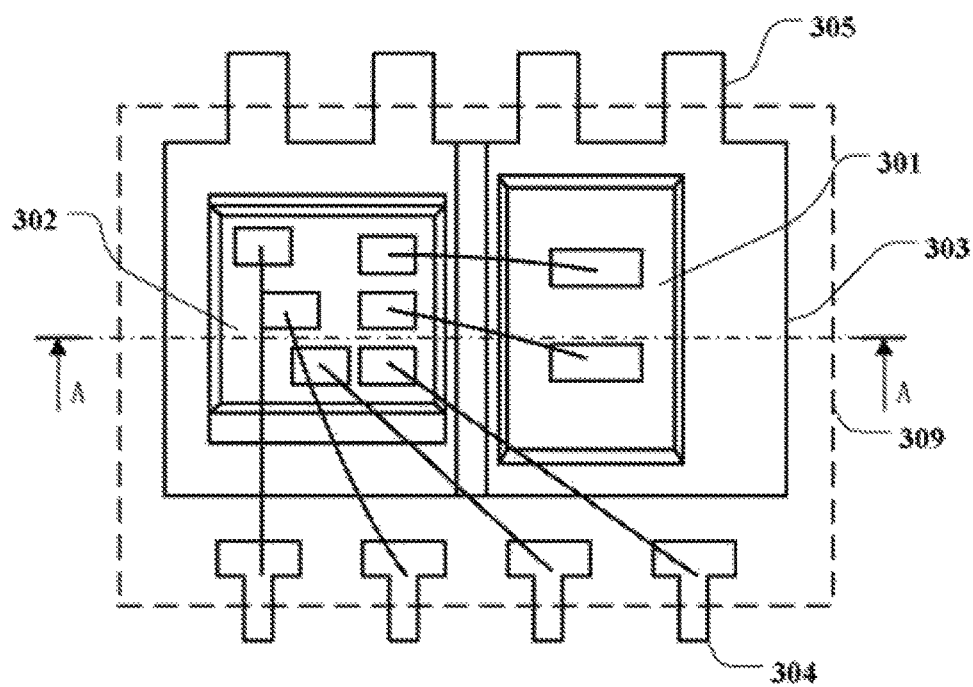
Figure 5C:
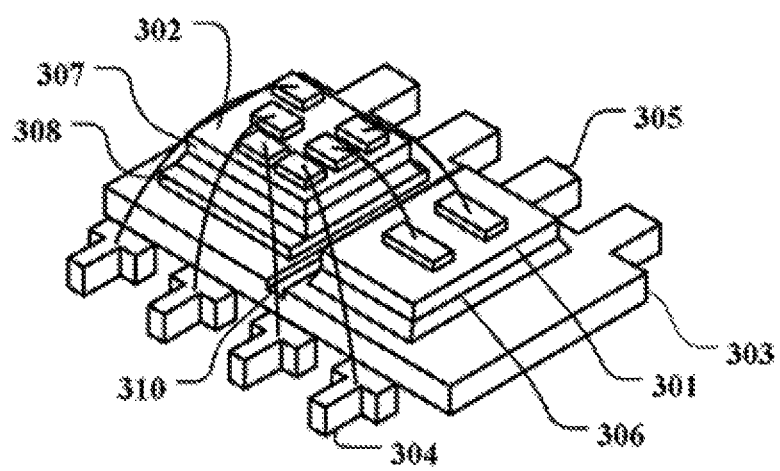

Referring now to FIGS. 5A-5C, shown are cross-section, top, and perspective stereograph views of a third example package structure of a power converter, in accordance with embodiments of the present invention. The cross-sectional view of FIG. 5A is obtained by cutting along line A-A of FIG. 5B. Also, the boundary of encapsulation compound 309 overlapping power dies and control circuit is indicated by dotted lines. This particular example package structure of a power converter can include encapsulation compound 309, die pad 303, groove 310, conductive adhesive layer 306, insulation adhesive layer 307, insulation adhesive layer 308, pins 304, and pins 305.

Die pad 303, pins 304, and pins 305 may be configured as different portions of a leadframe, and die pad 303 and four pins 305 can be formed integrally. The leadframe can be formed by copper, and by a stamping process. Conductive adhesive layer 306 can be arranged on die pad 303, and power device die 301 may be arranged on conductive adhesive layer 306. Conductive adhesive layer 306 can be configured as a heat dissipation path, and as an electrical connection path between die pad 303 and power device die 301. The heat of power device die 301 can thus be well dissipated by second pins 305. Die pad 303 may occupy the largest area of the entire package structure, and can be connected to all of pins 305 on one side of the package structure, in order to provide improved heat dissipation path for power device die 301.

Insulation adhesive layer 307 (e.g., epoxy) can be formed on the back surface of control circuit die 302, such as by at least one WBC process. Insulation adhesive layer 308 can be formed on die pad 303, such as by a dispensing process. When insulation adhesive layer 308 is cured, control circuit die 302 with insulation adhesive layer 307 can be arranged on insulation adhesive layer 308. Control circuit die 302 may be fixed above die pad 203 through insulation adhesive layers 307 and 308. An insulation adhesive layer with a thickness of approximately 30 um and that includes insulation adhesive layers 307 and 308 can achieve relatively high voltage isolation between control circuit die 302 and power device die 301.

Die pad 303 may have groove 310 arranged between conductive adhesive layer 306 and the insulation adhesive layer that includes insulation adhesive layers 307 and 308. Side wall 210 can be formed integrally with die pad 203 as portions of the leadframe. For example, groove 310 can surround at least one of power device die 301 and control circuit die 302. In view that before curing, conductive adhesive layer 306 may flow to the region beneath control circuit die 302, conductive adhesive layer 306 may be connected to insulation adhesive layers 307 and 308. However, because groove 310 can block the flow of conductive adhesive layer 306 to separate conductive adhesive layer 306 and the insulation layer, the space between conductive adhesive layer 306 and the insulation layer that includes insulation adhesive layers 307 and 308 can be smaller to decrease the length of bonding wires to improve the electrical performance, and to decrease the volume of the package structure.

Figure 11:
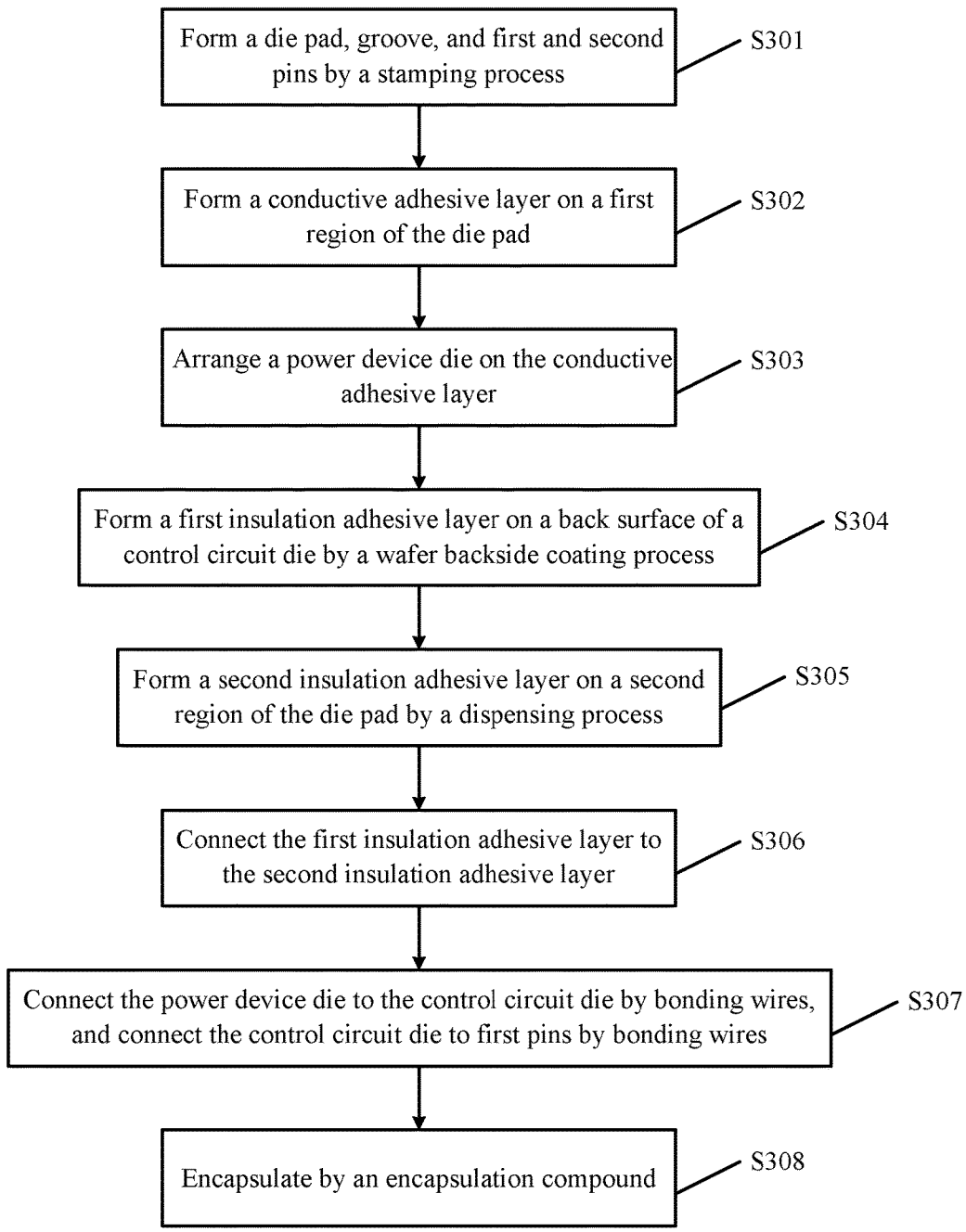
FIG. 11 is a flow diagram of a third example method of making a package structure of a power converter, in accordance with embodiments of the present invention.

Referring now to FIG. 11, shown is a flow diagram of a third example method of making a package structure of a power converter, in accordance with embodiments of the present invention. At S301, die pad 303, groove 310, pins 304, and pins 305 can be formed, such as by a stamping process. At S302, conductive adhesive layer 306 can be formed on a first region of die pad 303. At S303, power device die 301 can be arranged on conductive adhesive layer 306. At S304, insulation adhesive layer 307 can be formed on the back surface of control circuit die 302, such as by a WBC process. At S305, insulation adhesive layer 308 can be formed on a second region of die pad 303, such as by a dispensing process. At S306, insulation adhesive layer 307 can be connected to insulation adhesive layer 308. At S307, power device die 301 can be connected to control circuit die 302 by bonding wires, and control circuit die 302 can be connected to pins 304 by bonding wires. At S308, the structure can be encapsulated by an encapsulation compound.

Figure 6A:
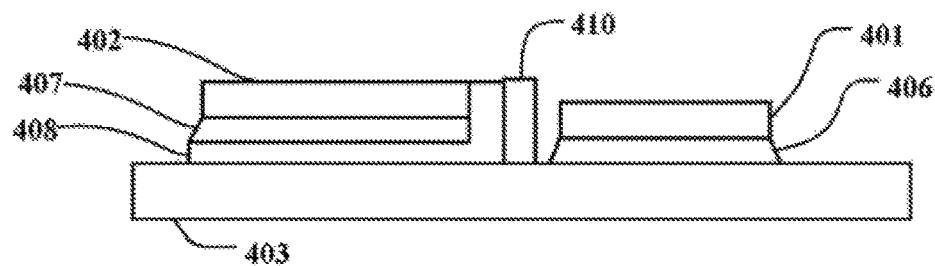
FIGS. 6A-6C are cross-section, top, and perspective stereograph views of a fourth example package structure of a power converter, in accordance with embodiments of the present invention.
Figure 6B:
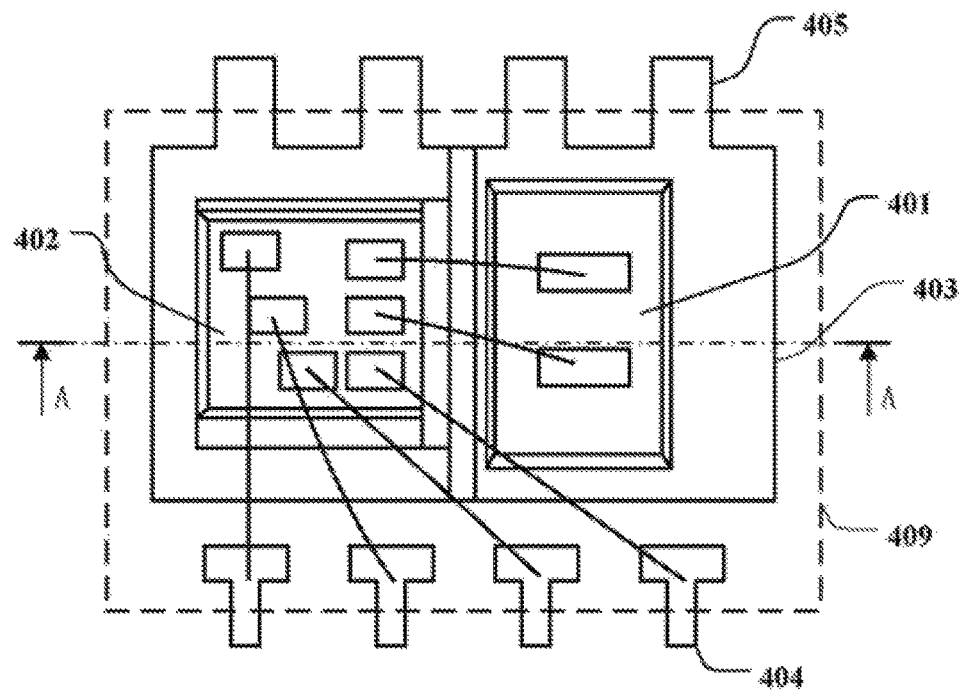
Figure 6C:
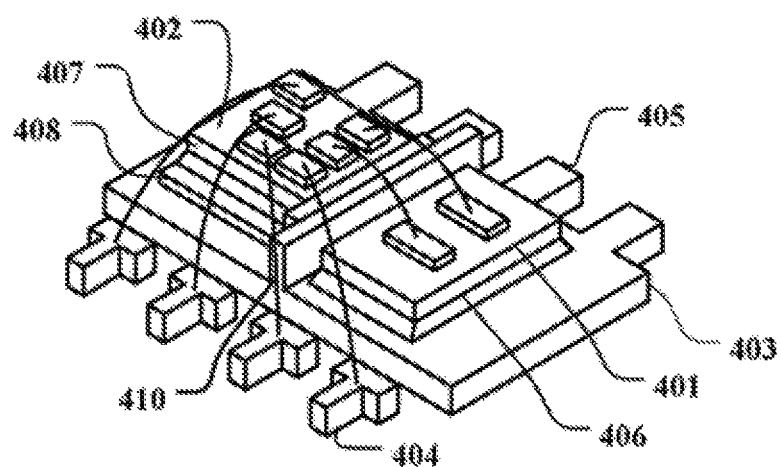

Referring now to FIGS. 6A-6C, shown are cross-section, top, and perspective stereograph views of a fourth example package structure of a power converter, in accordance with embodiments of the present invention. The cross-sectional view of FIG. 6A is obtained by cutting along line A-A of FIG. 6B. Also, the boundary of encapsulation compound 409 overlapping power dies and control circuit is indicated by dotted lines. This example package structure of a power converter can include encapsulation compound 409, die pad 403, side wall 410, conductive adhesive layer 406, insulation adhesive layer 407, insulation adhesive layer 408, pins 404, and pins 405.

Die pad 403, pins 404, and pins 405 may be configured as different portions of a leadframe, and die pad 403 and four pins 405 can be formed integrally. The leadframe can be formed by copper, such as by a stamping process. Conductive adhesive layer 406 can be arranged on die pad 403, and power device die 401 may be arranged on conductive adhesive layer 406. Conductive adhesive layer 406 may be configured as a heat dissipation path and electrical connection path between die pad 403 and power device die 401. The heat of power device die 401 can be well dissipated by pins 405. Die pad 403 may occupy the largest area of the entire package structure, and can be connected to all of pins 405 on one side of the package structure to provide improved heat dissipation path for power device die 401.

Insulation adhesive layer 407 (e.g., epoxy) may be formed on the back surface of control circuit die 402, such as by at least one WBC process. Insulation adhesive layer 408 can be formed on die pad 403, such as by a dispensing process. When insulation adhesive layer 408 is cured, control circuit die 402 with insulation adhesive layer 407 can be arranged on insulation adhesive layer 408. Control circuit die 402 may be fixed above die pad 403 through insulation adhesive layers 407 and 408. An insulation adhesive layer with a thickness of approximately 30 um including insulation adhesive layer 407s and 408 can be configured to achieve high voltage isolation between control circuit die 402 and power device die 401.

Side wall 410 formed by insulation material may be arranged on die pad 403, and between conductive adhesive layer 406 and the insulation adhesive layer that includes insulation adhesive layers 407 and 408. Side wall 410 can be formed integrally with die pad 403 as portions of the leadframe. For example, side wall 410 can surround at least one of power device die 401 and control circuit die 402. In this particular example, insulation adhesive layer 408 can extend along the sidewall of side wall 410 adjacent to control circuit die 402, in order to improve the stability of control circuit die 402.

Prior to curing, conductive adhesive layer 406 may flow to the region beneath control circuit die 404, and conductive adhesive layer 406 may connect with insulation adhesive layers 407 and 408. However, side wall 410 can block the flow of conductive adhesive layer 406, in order to separate conductive adhesive layer 406 and the insulation adhesive layer. The space between conductive adhesive layer 406 and the insulation adhesive layer that includes insulation adhesive layers 407 and can be smaller, in order to decrease the length of bonding wires, which can improve the electrical performance, and decrease the volume of the package structure.

Figure 12:
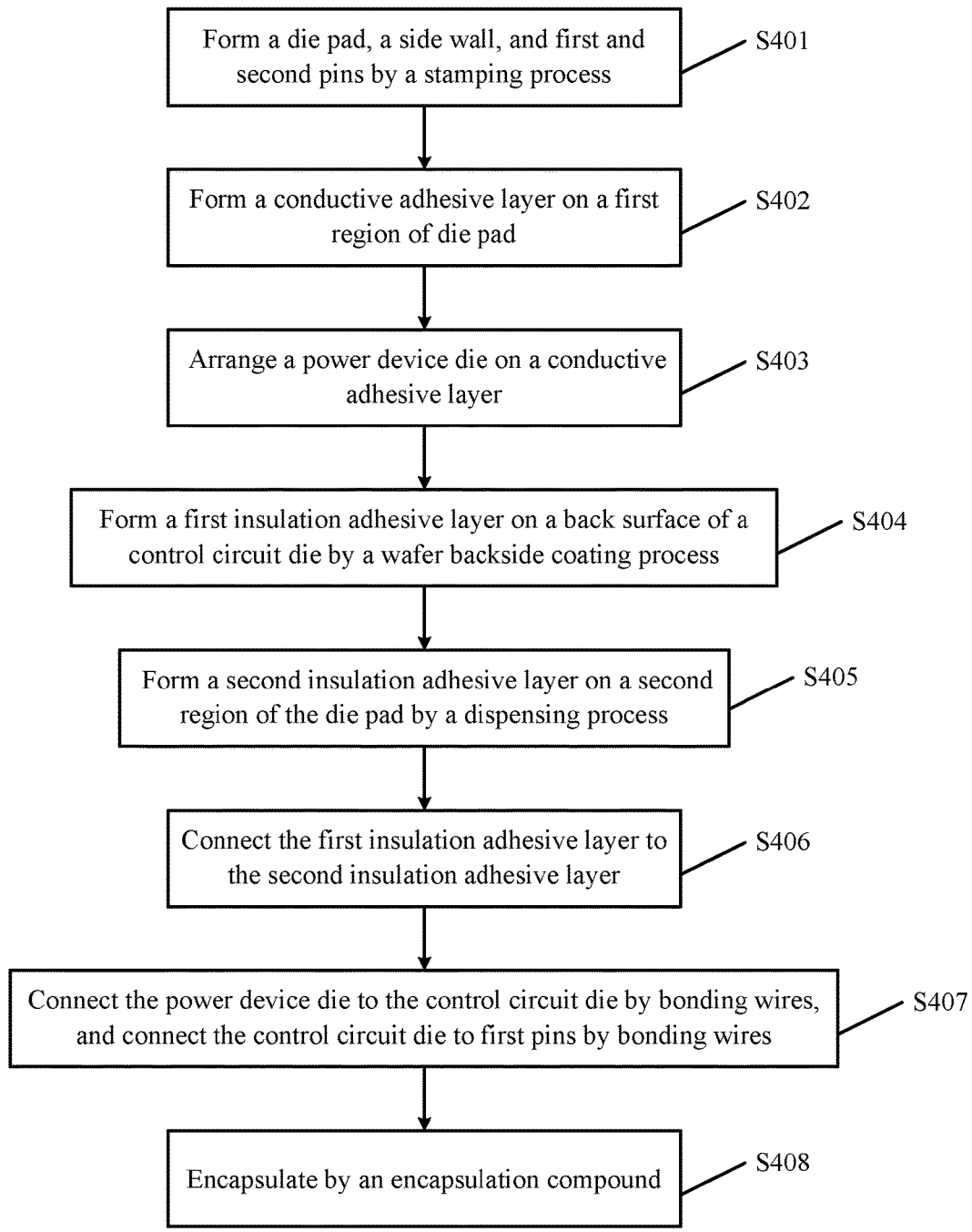
FIG. 12 is a flow diagram of a fourth example method of making a package structure of a power converter, in accordance with embodiments of the present invention.

Referring now to FIG. 12, shown is a flow diagram of a fourth example method of making a package structure of a power converter, in accordance with embodiments of the present invention. At S401, die pad 403, side wall 410, and pins 404 and 405 can be formed by a stamping process. At S402, conductive adhesive layer 406 may be formed on a first region of die pad 403. At S403, power device die 401 can be arranged on conductive adhesive layer 406. At S404, insulation adhesive layer 407 may be formed on the back surface of control circuit die 404, such as by a WBC process. At S405, insulation adhesive layer 408 can be formed on a second region of die pad 403, such as by a dispensing process. At S406, insulation adhesive layer 407 may be connected to insulation adhesive layer 408. At S407, power device die 401 can be to control circuit die 402 by bonding wires, and control circuit die 402 may be connected to pins 404 by bonding wires. At S408, the structure can be encapsulated by encapsulation compound.

Figure 7A:
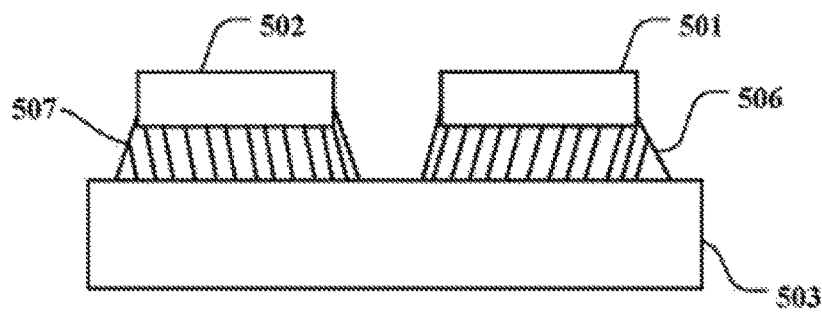
FIGS. 7A-7B are cross-section and top views of a fifth example package structure of a power converter, in accordance with embodiments of the present invention.
Figure 7B:
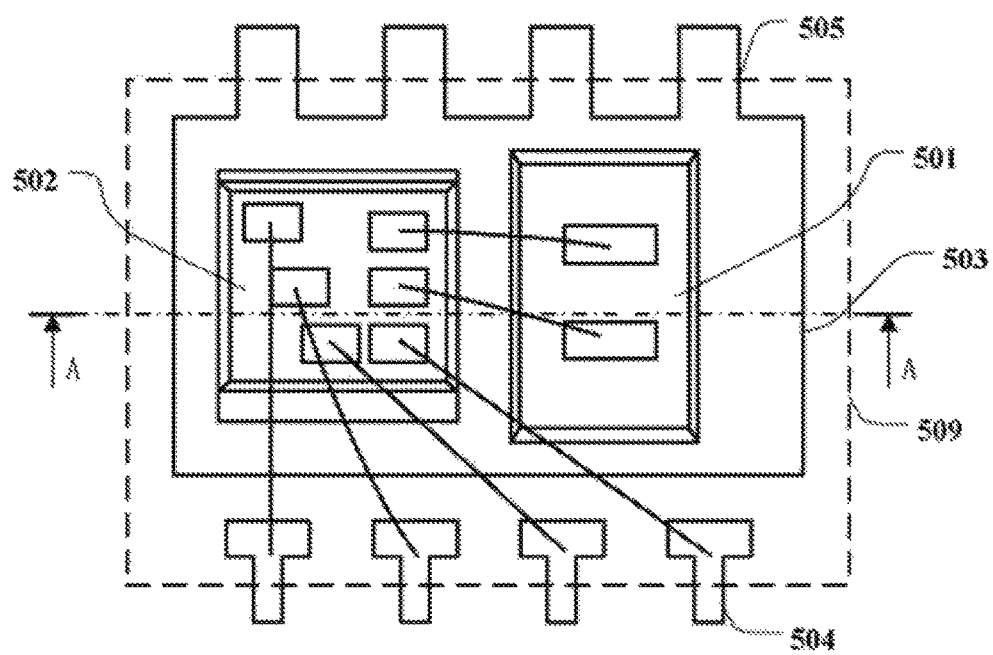

Referring now to FIGS. 7A-7B, shown are cross-section and top views of a fifth example package structure of a power converter, in accordance with embodiments of the present invention. The cross-sectional view of FIG. 7A is obtained by cutting along line A-A of FIG. 7B. The boundary of encapsulation compound 509 overlapping power dies and control circuit is indicated by dotted lines. This example package structure of power converter can include encapsulation compound 509, die pad 503, conductive adhesive layer 506, insulation adhesive layer 507, pins 504, and pins 505.

Die pad 503, and pins 504 and 505 may be configured as different portions of a leadframe, and die pad 503 and four pins 505 can be formed integrally. The leadframe can be formed by copper, and by a stamping process. Conductive adhesive layer 506 can be arranged on die pad 503, and power device die 501 may be arranged on conductive adhesive layer 506. Conductive adhesive layer 506 can be configured as heat dissipation path, and as an electrical connection path between die pad 503 and power device die 501. The heat of power device die 501 can thus be well dissipated by pins 505. Die pad 503 may occupy the largest area of the entire package structure, and can be connected to all of pins 505 on one side of the package structure to provide improved heat dissipation path for power device die 501.

The thickness of insulation adhesive layer 507 (e.g., epoxy) may not be less than 25 um, in order to achieve high voltage isolation between control circuit die 502 and die pad 503. Insulation adhesive layer 507 may be formed on the back surface of control circuit die 502, such as by at least two WBC processes. After the previous coating by a WBC process is cured, the next WBC process can occur. Also, insulation adhesive layer 507 may be pasted on die pad 503 to fix control circuit die 502 to die pad 503.

Figure 8A:
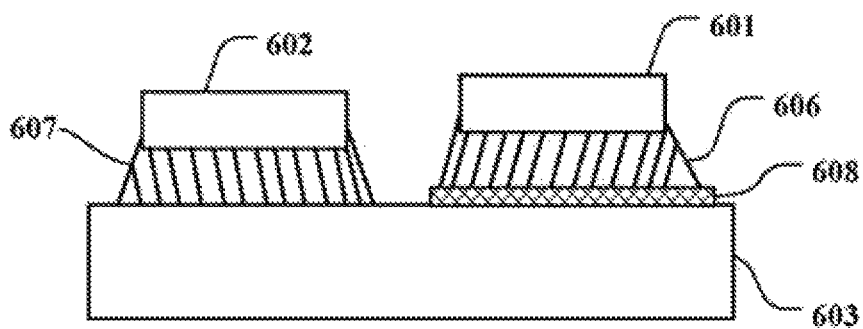
FIGS. 8A-8B are cross-section and top views of a sixth example package structure of a power converter, in accordance with embodiments of the present invention.
Figure 8B:
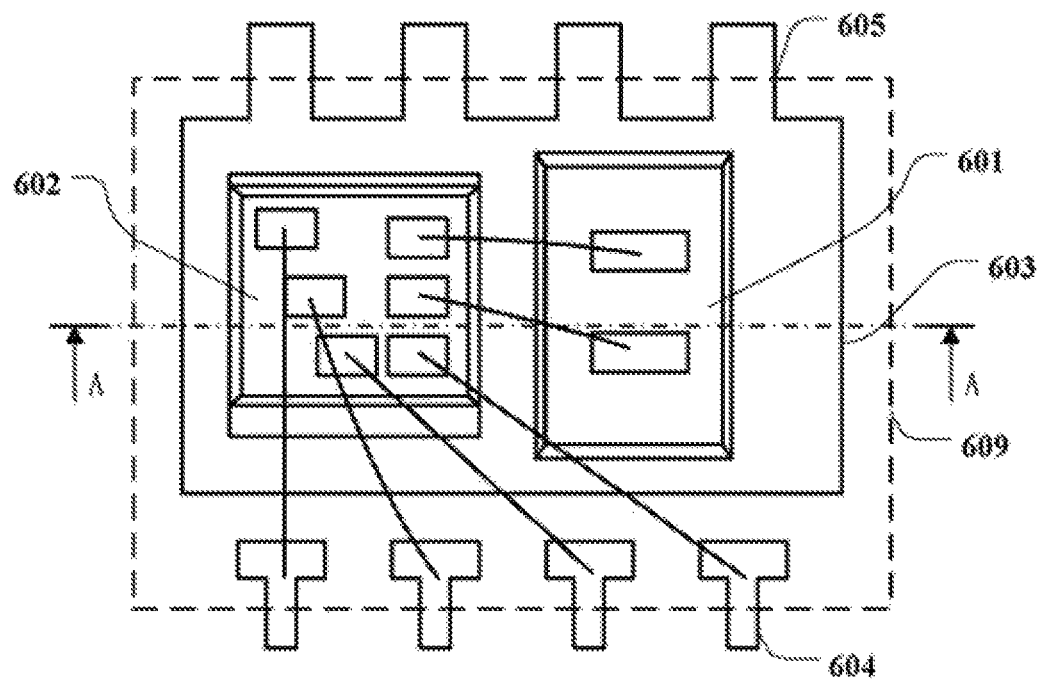

Referring now to FIGS. 8A-8B, shown are cross-section and top views of a sixth example package structure of a power converter, in accordance with embodiments of the present invention. The cross-sectional view of FIG. 8A is obtained by cutting along line A-A of FIG. 8B. The boundary of encapsulation compound 609 overlapping power dies and control circuit is indicated by dotted lines. This particular example package structure of a power converter can include encapsulation compound 609, die pad 603, conductive adhesive layer 606, insulation adhesive layer 607, coating layer 608, pins 604, and pins 605. Coating layer 608 (e.g., formed by metal Ag) may be arranged between conductive adhesive layer 606 and die pad 603, in order to protect the surface of die pad 603 from oxidizing, and to increase stability.

Power device die 601 may be arranged on conductive adhesive layer 606. Conductive adhesive layer 506 can be configured as a heat dissipation path, and an electrical connection path between die pad 603 and power device die 601. Die pad 603 may occupy the largest area of the entire package structure, and can be connected to all of pins 605 on one side of the package structure, in order to provide improved heat dissipation path for power device die 601. The thickness of insulation adhesive layer 607 (e.g., epoxy) may not be less than about 25 um, in order to achieve a relatively high voltage isolation between control circuit die 602 and die pad 603. Insulation adhesive layer 607 may be formed on the back surface of control circuit die 602, such as by at least two WBC processes. After the previous coating by WBC process is cured, the next WBC process can occur. Also, insulation adhesive layer 607 may be pasted on die pad 603, in order to fix control circuit die 602 to die pad 603.

In particular embodiments, a package structure of a power converter may have a die pad that occupies the largest area of the entire package structure, and can be connected to all pins on one side of the package structure, in order to provide improved heat dissipation path for power device die. Therefore, the heat of power device die generated in operation can be relatively well dissipated. Also, the insulation adhesive layer can achieve good insulation performance and high voltage isolation between the control circuit die and the power device die. In one example, a side wall or groove can be arranged between the conductive adhesive layer and the insulation adhesive layer in order to block the flow of the conductive adhesive, and to separate the conductive adhesive layer from the insulation adhesive layer. Therefore, the space between the conductive adhesive layer and the insulation adhesive layer can be reduced. Due to use of such a side wall or groove, the length of the bonding wires can be reduced, in order to decrease the volume of the package structure, and to improve the electrical performance.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package structure of a power converter, the package structure comprising:
    a) a die pad;
    b) an insulation adhesive layer on said die pad, wherein said insulation adhesive layer comprises connected first and second insulation adhesive layers that are nonconductive;
    c) a conductive adhesive layer on said die pad, wherein said insulation adhesive layer is separated from said conductive adhesive layer;
    d) a control circuit die on said first insulation adhesive layer, wherein said first insulation adhesive layer is disposed on a back surface of said control circuit die, and said second insulation adhesive layer is disposed on a surface of said die pad, wherein said control circuit die is electrically isolated from said die pad by said first and second insulation adhesive layers;
    e) a plurality of first pins coupled to said control circuit die by a plurality of first bonding wires, and being configured as an electrical connection path to external circuitry;
    f) a side wall that is separate from and disposed between said insulation adhesive layer and said conductive adhesive layer; and
    g) a power device die on said conductive adhesive layer, wherein neither of said control circuit die and said power device die are disposed on said side wall.

2. The package structure of claim 1, wherein a thickness of said insulation adhesive layer is not less than 25 um.

3. The package structure of claim 1, wherein each of said first and second insulation adhesive layers comprises epoxy.

4. The package structure of claim 1, further comprising a plurality of second pins integral with said die pad, and being configured to provide a heat dissipation path and an electrical connection path, wherein said die pad occupies a substantial portion of said package structure.

5. The package structure of claim 4, wherein said plurality of second pins integral with said die pad are all on one side of said package structure.

6. The package structure of claim 5, wherein said plurality of second pins are the only pins on said one side of said package structure.

7. The package structure of claim 1, wherein said side wall is configured to protect said conductive adhesive from flowing to the region beneath said control circuit die during formation of said conductive adhesive layer.

8. The package structure of claim 1, wherein said side wall is integral with said die pad and extends from a surface of said die pad to a height greater than a height of said conductive adhesive layer.

9. The package structure of claim 8, wherein said side wall surrounds at least one of said control circuit die and said power device die.

10. The package structure of claim 1, wherein at least a portion of said insulation adhesive layer is filled between said side wall and said control circuit die.

11. The package structure of claim 1, further comprising a groove between said insulation adhesive layer and said conductive adhesive layer.

12. The package structure of claim 11, wherein said groove is configured to protect said conductive adhesive from flowing to the region beneath said control circuit die during formation of said conductive adhesive layer.

13. The package structure of claim 12, wherein said groove surrounds at least one of said control circuit die and said power device die.

14. The package structure of claim 1, further comprising a coating layer between said conductive adhesive layer and said die pad.

15. The package structure of claim 1, wherein said plurality of first pins is four pins that are only connected to said control circuit die by said plurality of first bonding wires.

16. The package structure of claim 1, further comprising a plurality of second bonding wires that electrically connect said control circuit die to said power device die.

* * * * *